(12) United States Patent
Preusse et al.

(10) Patent No.: US 7,981,793 B2
(45) Date of Patent: Jul. 19, 2011

(54) METHOD OF FORMING A METAL DIRECTLY ON A CONDUCTIVE BARRIER LAYER BY ELECTROCHEMICAL DEPOSITION USING AN OXYGEN-DEPLETED AMBIENT

(75) Inventors: Axel Preusse, Radebeul (DE); Charlotte Emnet, Dresden (DE); Susanne Wehner, Dresden (DE)

(73) Assignee: Advanced Micro Devices, Inc., Austin, TX (US)

( * ) Notice: Subject to any disclaimer, the term of this patent is extended or adjusted under 35 U.S.C. 154(b) by 517 days.

(21) Appl. No.: 12/045,907

(22) Filed: Mar. 11, 2008

(65) Prior Publication Data

US 2009/0061621 A1 Mar. 5, 2009

(30) Foreign Application Priority Data

Aug. 31, 2007 (DE) .......................... 10 2007 041 213

(51) Int. Cl.
*H01L 21/44* (2006.01)
(52) U.S. Cl. ........ 438/653; 438/691; 438/627; 438/745; 438/704; 438/115; 257/774; 257/751; 257/682
(58) Field of Classification Search .................. 438/627, 438/751, 745, FOR. 385, 629, 689, 704, 115, 438/963, 653, 643, 691; 257/682, 751, 774
See application file for complete search history.

(56) References Cited

U.S. PATENT DOCUMENTS

| | | | |
|---|---|---|---|
| 5,800,626 A | 9/1998 | Cohen et al. | 134/1.3 |
| 6,158,447 A | 12/2000 | Kamikawa et al. | 134/56 R |
| 6,167,891 B1 | 1/2001 | Kudelka et al. | 134/1.3 |
| 6,943,115 B2 | 9/2005 | Horiuchi et al. | 438/692 |
| 2002/0027082 A1 | 3/2002 | Andricacos et al. | 205/157 |
| 2005/0048768 A1* | 3/2005 | Inoue et al. | 438/629 |
| 2006/0024951 A1* | 2/2006 | Schuehrer et al. | 438/627 |

FOREIGN PATENT DOCUMENTS

| | | |
|---|---|---|
| DE | 10228998 B4 | 5/2004 |
| EP | 1496542 A2 | 1/2005 |

OTHER PUBLICATIONS

Kim and Duquette, "Effect of Chemical Composition on Adhesion of Directly Electrodeposited Copper Film on TiN," *Journal of the Electrochemical Society*, 153:C417-21, 2006.

Kwon et al., "Electromigration resistance-related microstructural change with rapid thermal annealing of electroplated copper films," *Thin Sold Films*, 475:58-62, 2005.

Translation of Official Communication from German Patent Office for German Patent Application No. 10 2007 053 600.5-33 dated Jun. 20, 2008.

* cited by examiner

*Primary Examiner* — Thao X Le
*Assistant Examiner* — Thanh Y Tran
(74) *Attorney, Agent, or Firm* — Williams, Morgan & Amerson, P.C.

(57) ABSTRACT

By suppressing the presence of free oxygen during a cleaning process and a subsequent electrochemical deposition of a seed layer, the quality of a corresponding interface between the barrier material and the seed layer may be enhanced, thereby also improving performance and the characteristics of the finally obtained metal region. Thus, by identifying free oxygen as a main source for negatively affecting the characteristics of metals during a "direct on barrier" plating process, efficient strategies have been developed and are disclosed herein to provide a reliable technique for volume production of sophisticated semiconductor devices.

22 Claims, 6 Drawing Sheets

METHOD OF FORMING A METAL DIRECTLY ON A CONDUCTIVE BARRIER LAYER BY ELECTROCHEMICAL DEPOSITION USING AN OXYGEN-DEPLETED AMBIENT

BACKGROUND OF THE INVENTION

1. Field of the Invention

The present disclosure generally relates to the field of fabrication of integrated circuits, and, more particularly, to manufacturing an interconnect structure requiring a barrier layer formed between a bulk metal and a dielectric, wherein the metal may be directly deposited on the barrier layer by electrochemical deposition techniques.

2. Description of the Related Art

In a complex integrated circuit, a very large number of circuit elements, such as transistors, capacitors, resistors and the like, are formed in or on an appropriate substrate, usually in a substantially planar configuration. Due to the large number of circuit elements and the required complex layout of the integrated circuits, generally the electrical connection of the individual circuit elements may not be established within the same level on which the circuit elements are manufactured, but requires one or more additional "wiring" layers, also referred to as metallization layers. These metallization layers generally include metal lines, providing the inner-level electrical connection, and also include a plurality of inter-level connections, also referred to as vias, wherein the metal lines and vias may also be commonly referred to as interconnect structures.

Due the continuous shrinkage of the feature sizes of circuit elements in modern integrated circuits, the number of circuit elements for a given chip area, that is the packing density, also increases, thereby requiring an even larger increase in the number of electrical interconnections to provide the desired circuit functionality. Therefore, the number of stacked metallization layers typically increases as the number of circuit elements per chip area becomes larger. Since the fabrication of a plurality of metallization layers entails extremely challenging issues to be solved, such as mechanical, thermal and electrical reliability of many stacked metallization layers that are required, for example, for sophisticated microprocessors, semiconductor manufacturers are increasingly using a metal that allows high current densities and reduced dimensions of the interconnections. For example, copper is a metal generally considered to be a viable candidate due to its superior characteristics in view of higher resistance against electromigration and significantly lower electrical resistivity when compared with other metals, such as aluminum that has been used over the last decades. In spite of these advantages, copper also exhibits a number of disadvantages regarding the processing and handling of copper in a semiconductor facility. For instance, copper may not be efficiently applied onto a substrate in larger amounts by well-established deposition methods, such as chemical vapor deposition (CVD), and also may not be effectively patterned by the usually employed anisotropic etch procedures due to its lack of forming volatile etch byproducts. In manufacturing metallization layers including copper, the so-called damascene technique is therefore preferably used wherein a dielectric layer is first applied and then patterned to receive trenches and vias, which are subsequently filled with copper. A further major drawback of copper is its property to readily diffuse in low-k dielectric materials, silicon and silicon dioxide, which is a well-established and approved dielectric material in fabricating integrated circuits.

It is therefore necessary to employ a so-called barrier material in combination with a copper-based metallization to substantially avoid any out-diffusion of copper into the surrounding dielectric material, as copper may readily migrate to sensitive semiconductor areas, thereby significantly changing the characteristics thereof On the other hand, the barrier material may suppress the diffusion of reactive components into the metal region. The barrier material provided between the copper and the dielectric material should exhibit, however, in addition to the required barrier characteristics, good adhesion to the dielectric material as well as to the copper and should also have as low an electrical resistance as possible so as to not unduly compromise the electrical properties of the interconnect structure. Moreover, the barrier layer may also act as a "template" for the subsequent deposition of the copper material in view of generating a desired crystalline configuration, since a certain degree of information of the texture of the barrier layer may be transferred into the copper material to obtain a desired grain size and configuration. It turns out, however, that a single material may not readily meet the requirements imposed on a desired barrier material. Hence, a mixture of materials may be frequently used to provide the desired barrier characteristics. For instance, a bi-layer comprised of tantalum and tantalum nitride is often used as a barrier material in combination with a copper damascene metallization layer. Tantalum, which effectively blocks copper atoms from diffusing into an adjacent material even when provided in extremely thin layers, however, exhibits only a poor adhesion to a plurality of dielectric materials, such as silicon dioxide based dielectrics, so that a copper interconnection including a tantalum barrier layer may suffer from reduced mechanical stability especially during the chemical mechanical polishing of the metallization layer, which may be employed for removing excess copper and planarizing the surface for the provision of a further metallization layer. The reduced mechanical stability during the CMP process may, however, entail severe reliability concerns in view of reduced thermal and electrical conductivity of the interconnections. On the other hand, tantalum nitride exhibits excellent adhesion to silicon dioxide based dielectrics, but has very poor adhesion to copper. Consequently, in advanced integrated circuits having a copper-based metallization, typically a barrier bi-layer of tantalum nitride/tantalum is used. The demand for a low resistance of the interconnect structure in combination with the continuous reduction of the dimensions of the circuit elements and associated therewith of the metal lines and vias, requires that the thickness of the barrier layer be reduced, while nevertheless providing the required barrier effect. It has been recognized that tantalum nitride provides excellent barrier characteristics even if applied with a thickness of only a few nanometers and even less. Thus, sophisticated deposition techniques have been developed for forming thin tantalum nitride layers with high conformality even in high aspect ratio openings, such as the vias of advanced metallization structures, wherein the desired surface texture with respect to the further processing may also be obtained.

Since the dimensions of the trenches and vias have currently reached a width or a diameter of approximately 0.1 µm and even less with an aspect ratio of the vias of about 5 or more, the deposition of a barrier layer reliably on all surfaces of the vias and trenches and subsequent filling thereof with copper substantially without voids is a most challenging issue in the fabrication of modern integrated circuits. Currently, the formation of a copper-based metallization layer is accomplished by patterning an appropriate dielectric layer and depositing the barrier layer, for example comprised of tantalum (Ta) and/or tantalum nitride (TaN), by advanced physical vapor deposition (PVD) techniques, such as sputter deposition. Thereafter, the copper is filled in the vias and trenches, wherein electroplating has proven to be a viable process technique, since it is capable of filling the vias and trenches with a high deposition rate, compared to chemical vapor deposition (CVD) and PVD rates, in a so-called bottom-up regime, in which the openings are filled starting at the bottom in a substantially void-free manner. Generally, when electroplating a metal, an external electric field is applied between the surface to be plated and the plating solution. Since substrates for semiconductor production may be contacted at restricted areas, usually at the perimeter of the substrate, a conductive layer covering the substrate and the surfaces that are to receive a metal has to be provided. Although the barrier layer previously deposited over the patterned dielectric may act as a current distribution layer, it turns out, however, that, in view of crystallinity, uniformity and adhesion characteristics, a so-called seed layer is preferably to be used in the subsequent electroplating process to obtain copper trenches and vias having the required electrical and mechanical properties. The seed layer, usually comprised of copper, is typically applied by sputter deposition using substantially the same process tools as are employed for the deposition of the barrier layer, wherein these deposition techniques may provide the desired texture of the seed layer in combination with the previously deposited barrier material, thereby creating appropriate conditions for the subsequent filling in of the bulk metal.

For dimensions of 0.1 µm and less of vias in future device generations, the sputter deposition of extremely thin metal layers having a high degree of conformity as required for the barrier layer and the seed layer may become a limiting factor, since the step coverage characteristics of the above-described advanced sputter tools may not be further enhanced without significant modifications of these tools, which seems to not be a straightforward development. While the deposition of the barrier layer may be performed on the basis of other highly conformal techniques, such as atomic layer deposition (ALD), which is a well-controllable self-limiting CVD-like process, it appears that the characteristics of the seed layer may be difficult to obtain by these sophisticated techniques, while throughput may also be compromised, thereby making these techniques less attractive for the deposition of the seed material. Since the deposition of the seed layer may not be performed in a straightforward manner by PVD, and due to the fact that PVD techniques producing extremely thin layers appropriate for barrier layers may result, when applied to the formation of seed layers, in an increased electric resistance, the performance of the final metal region as well as the initial deposition rate of the subsequent electroplating process may be negatively affected. That is, in particular, seed layers formed by advanced CVD techniques may be inferior to commonly used PVD seed layers due to a significant incorporation of contaminants, thereby resulting in higher electric resistance and weak texture that may, in turn, entail nearly randomly textured metal films.

It has therefore been proposed to form a copper seed layer by electrochemical deposition techniques in an attempt to enhance the step coverage and quality of the seed material while also achieving increased throughput. For example, respective electrolyte solutions are available, which may be used for directly plating copper on a tantalum-based barrier layer, wherein it is proposed to perform a wet chemical clean process on the basis of diluted hydrofluoric acid (HF) prior to starting the plating process so as to remove unwanted contaminants and activate the tantalum-containing surface of the barrier layer. Although the direct plating is a promising approach, in particular with the prospect of further device scaling, it turns out that performance of the final metal lines and vias, for instance in view of electromigration behavior, crystallinity and thus electrical characteristics is inferior compared to devices comprising a PVD deposited seed material, thereby making this approach less attractive for usage in mass production of advanced semiconductor devices.

The present disclosure is directed to various methods and techniques that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the subject matter disclosed herein relates to a technique that enables the formation of metal-filled openings in a patterned dielectric layer wherein electrochemical deposition processes may be used on the basis of a previously formed barrier layer. According to this direct deposition of a desired metal, such as copper, directly on the barrier materials, the limitations of physical vapor deposition techniques, such as sputter deposition, for providing seed layers for a subsequent electrochemical deposition may be overcome, while concurrently providing the required characteristics of the seed layer or an initially deposited portion of the metal under consideration in order to obtain the desired performance of the metal lines and vias with respect to electromigration, conductivity, mechanical strength and the like. For this purpose, it has been recognized that an interface between the barrier material and the electrochemically deposited metal may represent a most critical area at which a reaction of the barrier material with oxygen has to be suppressed so as to substantially avoid the formation of oxygen-containing components, such as oxides and the like, which may have a strong influence on the overall characteristic of the metal to be filled in since, as previously explained, the crystallinity, i.e., grain orientation, size thereof and the like, may critically depend on the deposition conditions at the barrier to metal interface. Consequently, based on the recognition that the presence of even minute amounts of oxygen may critically affect the electrochemical deposition of the material under consideration, methods are disclosed herein in which a process sequence may be established with a significantly reduced reaction rate between oxygen and the barrier surface. In this way, presently available process techniques for directly depositing a copper material on barrier layers, such as tantalum-based barrier layers, may be significantly enhanced, thereby rendering such "direct on barrier" plating techniques as viable candidates for reliable manufacturing processes for forming metallization structures of any sophisticated microstructure devices.

One illustrative method disclosed herein comprises forming a conductive barrier layer on a patterned layer of a semiconductor device and treating a wet chemical cleaning solution for cleaning the barrier layer so as to remove oxygen dissolved therein. The method further comprises cleaning the barrier layer by using the wet chemical cleaning solution in a cleaning ambient designed to suppress exposure of the wet chemical cleaning solution and the barrier layer to oxygen. Finally, the method comprises directly depositing a metal on the barrier layer by an electrochemical deposition process in a deposition ambient designed to suppress exposure to oxygen during deposition.

A further illustrative method disclosed herein comprises forming a barrier layer on a surface portion of an opening that is formed in a dielectric layer of a semiconductor device. The method further comprises performing a process sequence for directly depositing a metal on the barrier layer using an electrochemical deposition process in a process ambient designed to suppress contact of the barrier layer with oxygen during the process sequence.

One illustrative method for directly depositing a metal on a barrier layer by an electrochemical deposition process is disclosed herein and comprises providing a substrate comprising a patterned layer having formed thereon the barrier layer. Furthermore, a process ambient is established to suppress a reaction of the barrier layer with oxygen. Furthermore, the method comprises cleaning the barrier layer in the process ambient and depositing at least a portion of the metal on the barrier layer within the process ambient.

BRIEF DESCRIPTION OF THE DRAWINGS

The disclosure may be understood by reference to the following description taken in conjunction with the accompanying drawings, in which like reference numerals identify like elements, and in which.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the subject matter disclosed herein provides techniques which enable or support direct electrochemical plating onto commonly used barrier materials, such as tantalum-based materials including tantalum, tantalum nitride and the like, while reducing an interface degradation, which may result in an inferior performance in conventionally formed metal regions formed by directly plating copper on a barrier material. For example, as previously discussed, electrolyte solutions may be available for the electroless deposition of a copper material directly on a tantalum-based barrier layer, wherein, prior to the actual electrochemical deposition, a wet chemical cleaning process on the basis of diluted hydrofluoric acid (HF) has to be performed to prepare and activate the tantalum-based barrier layer. However, respective techniques may not be compatible with the constraints imposed by sophisticated mass production techniques for sophisticated semiconductor devices. According to the principles disclosed herein, it has been recognized that an interface between the barrier layer and the directly deposited metal may have a significant influence on the overall performance of the finally obtained metal region. According to investigations performed by the inventors, as will be described later in more detail, an intermediate layer or portions thereof including a significant amount of oxygen may be formed during and after the wet chemical cleaning process and also prior to and during an initial phase of the electrochemical deposition process. Consequently, in illustrative aspects disclosed herein, process techniques are provided in which the presence of oxygen during the various manufacturing stages may be significantly suppressed, thereby creating appropriate process conditions for forming a high quality interface between the barrier material and the metal plated thereon by electrochemical processes. Consequently, according to these techniques, a seed layer may be provided in a highly conformal manner, even for highly scaled semiconductor devices including transistor elements of the 32 nm technology and beyond, wherein the seed layer may be used as an initial material for finally filling the respective opening or it may be used as a seed layer for a subsequent electrochemical deposition step, which may be based on well-established electroplating processes or electroless plating recipes. Moreover, since the initial layer that is directly plated on the barrier material may have the desired texture and mechanical strength, the technology disclosed herein may be reliably incorporated into volume production while on the other hand increasing throughput, since sophisticated deposition techniques, such as ALD, advanced PVD processes and the like, may no longer be required for providing an appropriate start layer for the electrochemical deposition process.

Figure 1A:
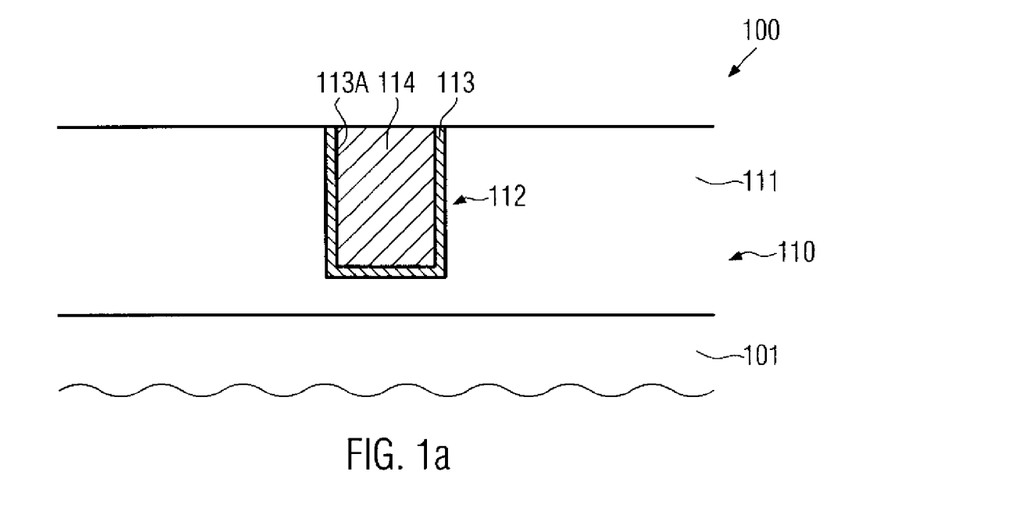
FIG. 1a schematically illustrates a cross-sectional view of a semiconductor device including a copper-based metal region formed on the basis of deposition techniques including a PVD process for forming a seed layer on a barrier layer followed by an electrochemical deposition process according to well-established techniques, thereby obtaining a high quality interface between the barrier material and the actual metal.
Figure 1B:
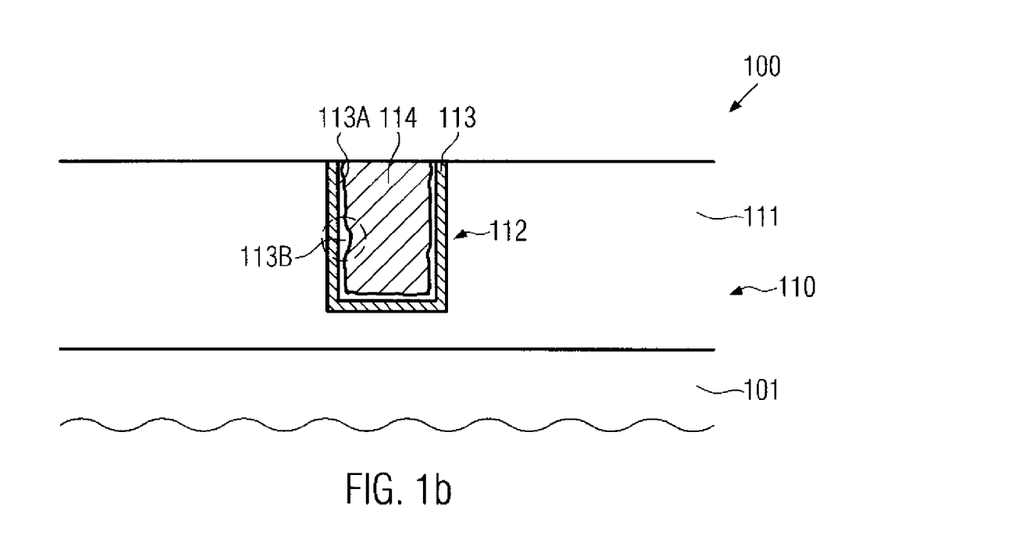
FIG. 1b schematically illustrates a cross-sectional view of a comparable semiconductor device, in which a metal region has been formed by direct plating on a barrier material, wherein inferior interface characteristics have been identified according to the subject matter disclosed herein, wherein the inferior interface quality may result in a reduced electromigration resistance and a compromised crystallinity.

With reference to FIGS. 1a-1b, illustrative semiconductor devices are described in order to identify the difficulties arising from conventional process techniques for directly plating a metal, such as copper, on an exposed barrier layer. Subsequently, with reference to FIGS. 2a-2g and 3a-3b, further illustrative embodiments of process techniques for directly forming metal on a barrier layer by electrochemical processes will be described.

FIG. 1a schematically illustrates a cross-sectional view of a semiconductor device 100, which may represent any microstructure device requiring the formation of sophisticated metal lines and vias therein. In this respect, the term "semiconductor device" is to be understood as a generic term for indicating any device fabricated in accordance with micro patterning techniques. The semiconductor device 100 may comprise a substrate 101, which may comprise any semiconductor elements, such as transistors, capacitors and the like, as are typically provided in highly advanced integrated circuits, such as microprocessors, memory circuits and the like. For this purpose, the substrate 101 may include any appropriate material for forming therein or thereon respective circuit elements. In other cases, the substrate 101 may represent any appropriate carrier material for forming thereabove a metallization structure 110 in accordance with device requirements, wherein not necessarily circuit elements may be incorporated in the substrate 101. The metallization structure 110 may comprise a dielectric material 111, which in sophisticated applications may comprise a dielectric material of reduced permittivity, wherein a dielectric constant may have a value of 3.0 and significantly less. In other cases, more conventional dielectric materials, such as silicon dioxide, silicon nitride and the like, may be used within the dielectric layer 111. The metallization structure 110 may further comprise a metal feature such as a metal line 112, which may have lateral dimensions, i.e., in FIG. 1a, the horizontal extension, of approximately 100 nm and even less at lower metallization levels of sophisticated semiconductor devices. For example, the metallization structure 110 may represent the first metal level or the contact level for providing direct electrical contact to circuit elements, such as transistors and the like, wherein the lateral dimensions of the metal region 112 may have to be adapted to the respective contact areas of the circuit elements. As previously explained, currently transistor elements having a gate length of 30 nm and less are available with the prospect of further device scaling in future device generations. The metal region 112 may comprise a barrier layer 113 so as to separate a metal 114, such as copper, from the surrounding dielectric material of the layer 111. In many conventional strategies, the barrier layer 113 may be comprised of one or more material compositions, such as tantalum and tantalum nitride, to provide the desired characteristics with respect to electrical and mechanical performance, as is explained above. Thus, the barrier layer 113, which may be comprised of two or more sub-layers, may provide the desired suppression of copper diffusion of the metal 114 into the dielectric material of the layer 111 and may also suppress an unwanted contact of reactive components, such as fluorine, oxygen and the like, with the metal 114. Furthermore, the barrier layer 113 may act as an adhesion layer for the metal 114.

In well-established process techniques, the semiconductor device 100 as shown in FIG. 1a may be formed on the basis of any appropriate process techniques for providing the substrate 101, which may have formed therein circuit elements or not, depending on the circumstances, wherein the metallization structure 110 may be formed by depositing the dielectric material of the layer 111 by any appropriate deposition technique, such as CVD, spin coating and the like. Thereafter, advanced patterning regimes, for instance comprising photolithography and anisotropic etch techniques, may be used in creating a respective opening, such as a trench or a via opening, having appropriate lateral dimensions as demanded by device requirements. Next, the barrier material may be deposited, wherein, for instance, advanced deposition techniques, such as PVD, ALD and the like, may be used to provide the desired material composition and obtain a desired surface texture as may be considered advantageous for the further processing of the device 100. For example, sophisticated PVD techniques, possibly in combination with appropriate re-sputter processes and sputter-based cleaning processes, may be used, as are well known in the art. Thereafter, a seed layer, such as a copper layer, may be formed, wherein, for the device 100 in FIG. 1a, a well-established PVD process sequence may be used to enable a thorough investigation of an interface 113A between the metal 114 and the barrier material 113 in a later stage in order to identify insufficiencies of conventional techniques for directly plating the metal 114 on the barrier layer 113. After the deposition of a respective seed layer (not shown), an electroplating process may be performed in order to fill the opening with the copper 114 according to well-established recipes, including the application of pulsed currents on the basis of appropriate electrolyte solutions and the like. It should be appreciated that the semiconductor device 100 of FIG. 1a has thus been formed in accordance with process strategies that result in an appropriate performance of the device 100, i.e., of the metal region 112, with respect to electrical and electromigration aspects. That is, the metal 114 may have an appropriate crystallinity, possibly obtained after performing a thermal treatment, thereby providing the desired conductivity. Furthermore, electromigration effects, that is, current or stress-induced copper diffusion in the metal region 112, may be maintained within an acceptable range.

FIG. 1b schematically illustrates the semiconductor device 100 when formed in accordance with conventional process techniques for directly plating the metal 114 on the barrier layer 113. For this purpose, after the deposition of the barrier layer 113, which may be accomplished on the basis of the same processes as previously described, thereby achieving a high degree of similarity of the corresponding process conditions, the barrier layer 113 may be subjected to a wet chemical cleaning process on the basis of diluted hydrofluoric acid (HF) to remove contaminants and "activate" the surface of the barrier layer 113 for a subsequent electroless deposition process. For this purpose, an appropriate electrolyte solution, as may, for instance, be available from Semitool Inc., may be provided with appropriate process conditions, i.e., elevated temperatures in the range of approximately 85-95° C., thereby initiating a self-catalyzing deposition of copper on the exposed surface of the barrier layer 113. After depositing a desired layer thickness, for instance, in the range of 40-100 nm, the device 100 may be further processed in an electroplating process tool, as previously described, thereby completely filling the respective opening with the metal 114. It should be appreciated that, although shown in FIGS. 1*a* and 1*b*, the removal of any excess material, for instance, on the basis of electrochemical etch techniques and CMP and the like, may not be performed for some of the investigations with respect to the quality of the respective interface 113A.

As previously indicated, according to the principles disclosed herein, in particular the interface 113A has been identified as a critical area, which may influence the finally obtained performance of the metal regions 112. In order to identify a difference of the respective interfaces 113A, and thus of the metal regions 112 in total, a plurality of analysis processes have been performed, thereby revealing the presence of oxygen-containing compounds 113B at the interface 113A of the device of FIG. 1*b*. For example, based on electron microscopy using cross-sectional samples, a clear indication was found for an additional intermittent layer, i.e., the contaminants 113B, comprising a high content of oxygen. For example, in samples of the device 100 formed according to the process flow described with reference to FIG. 1*b*, tantalum oxide has been identified to be present at the interface 113 with a thickness of approximately 2-3 nm for a thickness of the barrier layer 113 in the range of approximately 30-50 nm. In order to more clearly identify the type of material of the contaminants 113B, energy dispersion x-ray analysis (EDX) and electron energy loss spectroscopy measurements (EELS) have been performed, thereby identifying the presence of oxygen, for instance, in the form of tantalum oxide. The presence of the tantalum oxide at the interface 113A may influence the characteristics of the entire seed layer formed by a direct electroless deposition process, as previously described, so that also the characteristics of the bulk metal 114 may be influenced by the tantalum oxide. Strong evidence for a corresponding influence has been obtained by performing respective x-ray diffraction analysis (XRD) in order to determine the surface texture of the corresponding copper regions 114. Compared to the region 114 of the device 100 in FIG. 1*a*, formed on the basis of a PVD seed layer, a substantially random distribution of the grain orientations has been observed for the device 100 including the interface contamination layer 113B, thereby indicating a loss of "texture information transfer" from the barrier layer to the metal 114 via the corresponding seed layer. Moreover, in some illustrative embodiments, the devices 100, that is, respective representatives thereof, have been investigated prior to the deposition of the metal 114 after a corresponding seed layer has been deposited. Also in this case, a significant discrepancy with respect to surface roughness has been observed, wherein the directly plated seed layer exhibits a quite inhomogeneous surface with a significant variation in grain size and roughness. For example, holes were identified in the seed layer formed on the basis of direct plating techniques, thereby indicating inferior adhesion to the barrier or inhibited grain growth, both of which may be caused by the presence of the oxygen-containing layer at the interface 113B. Furthermore, even delamination areas have been detected in the metal region 112 of FIG. 1*b*, thereby resulting in a weakened interface area, which may contribute to reduced mechanical strength and also to increased electromigration effects, thereby contributing to a significantly reduced reliability of the respective metallization structure 110.

Consequently, based on the findings stated above, efficient techniques are disclosed herein so as to significantly suppress the presence of oxygen at critical process stages in forming a seed layer or an initial portion of a highly conductive metal, such as copper, directly on a barrier layer on the basis of electrochemical deposition techniques.

Figure 2A:
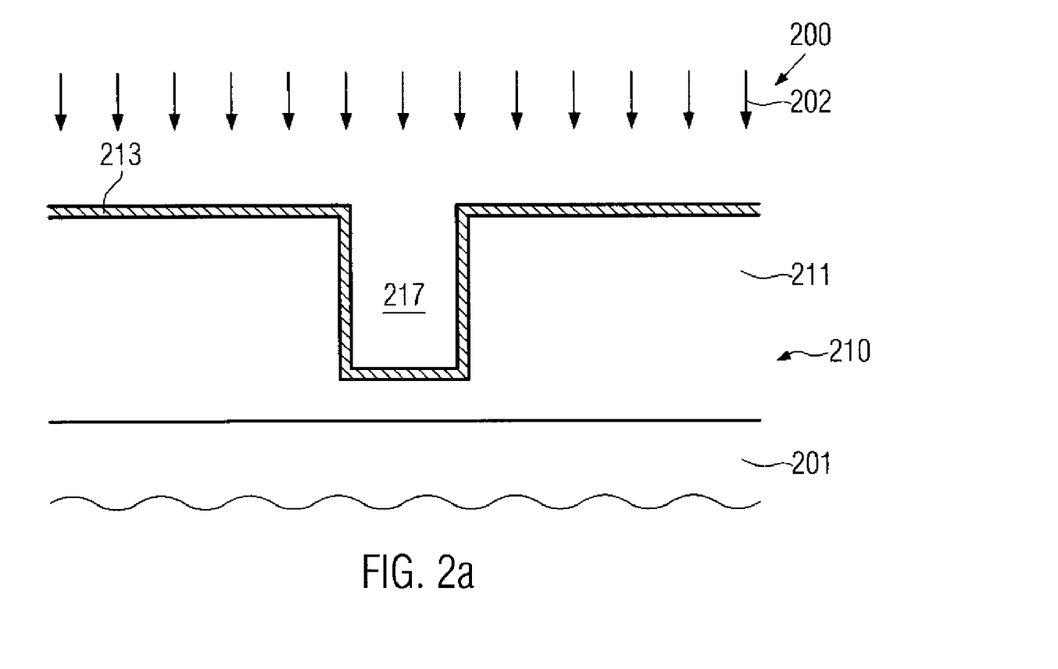
FIG. 2a schematically illustrates a cross-sectional view of a semiconductor device during a process for forming a barrier layer within an opening according to illustrative embodiments.

FIG. 2*a* schematically illustrates a semiconductor device 200 comprising a substrate 201 and a metallization structure 210 formed thereabove. With respect to the substrate 201 and the metallization structure 210, the same criteria apply as previously set forth with reference to the device 100. Furthermore, the metallization structure 210 comprises a dielectric layer 211, which may be comprised of any appropriate material, as previously discussed, wherein the layer 211 is patterned so as to include an opening 217, such as a via opening, a trench or the like. Furthermore, a barrier layer 213 may be formed on the patterned dielectric layer 211, wherein the barrier layer 213 may be comprised of any appropriate material composition that is suitable for providing the desired electrical, mechanical, chemical and other characteristics as required for sophisticated metal regions. In some illustrative embodiments, the barrier layer 213 is a tantalum-based layer, that is, at least a surface portion thereof comprises tantalum, wherein other components may be present, such as nitrogen, carbon and the like. It should further be appreciated that the barrier layer 213 may also be comprised of other materials, such as titanium, titanium nitride, cobalt, tungsten and the like. Furthermore, as previously discussed, any suitable layer stack may be used to obtain the desired barrier characteristics. For example, the surface portion of the barrier layer 213 may exhibit a desired texture, which may influence the grain orientation and size of the metal to be filled into the opening 217.

With respect to a process sequence for forming the semiconductor device 200 as shown in FIG. 2*a*, the same criteria apply as previously explained with reference to the device 100. That is, after the patterning of the dielectric layer 211, the barrier material 213 may be provided in one or more process steps of a deposition process 202, which may comprise self-limiting CVD techniques (i.e., ALD), PVD, electroless plating processes or any combination thereof.

Next, in some illustrative embodiments, the device 200 may be prepared for a subsequent electrochemical deposition process by performing a cleaning process, for instance, based on a wet chemical cleaning recipe. However, contrary to conventional strategies, the cleaning process may be performed in an appropriate ambient so as to suppress the presence of oxygen, thereby reducing the probability for creating any oxygen-based contamination products, such as the interface layer 113B.

Figure 2B:
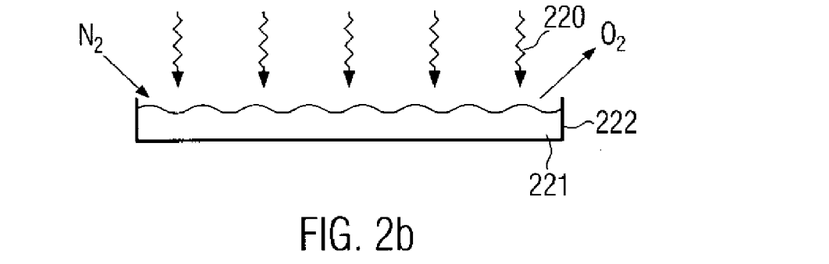
FIG. 2b schematically illustrates a treatment for removing or reducing the oxygen contents of a wet chemical cleaning solution according to illustrative embodiments.

FIG. 2*b* schematically illustrates a process for appropriately preparing a wet chemical cleaning solution according to one illustrative embodiment. As shown, a wet chemical cleaning solution 221, which may be contained in any appropriate container 222, may be subjected to a treatment 220 for reducing the amount of oxygen that may be dissolved in the solution 221. In one illustrative embodiment, the solution 221 may be comprised of a diluted hydrofluoric acid (DHF) which may be exposed to an appropriate ambient for actively degassing the solution 221, for instance, by establishing appropriate pressure conditions and providing substantially inert gases, such as nitrogen, argon, krypton and the like. Moreover, in some cases, the temperature of the solution 221 may be appropriately increased, for instance, up to 60-90° C., thereby enhancing the removal of oxygen. In other cases, an inert gas may be driven into the solution 221, thereby also enhancing the efficiency of oxygen removal in the solution 221. For example, the treatment 220 may be performed to reduce the contents of oxygen to 5 ppm or less. It should be appreciated that the container 222 may represent any appropriate container which may be positioned at a respective process tool or which may be any transport container for supplying the solution 221 to an appropriate process tool for cleaning the semiconductor device 200. In some illustrative embodiments, a respective supply line for delivering the solution 221 to the device 200 may be operated on the basis of a substantially inert ambient, thereby reducing the re-entrant of oxygen into the solution 221.

Figure 2C:
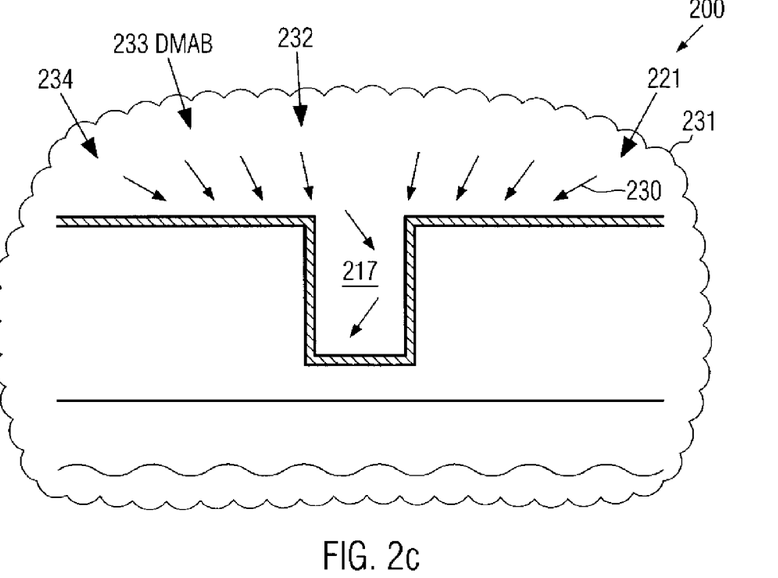
FIGS. 2c-2g schematically illustrate cross-sectional views of the semiconductor device of FIG. 2a during various manufacturing stages, wherein cleaning processes and electrochemical deposition processes and related process steps may be performed on the basis of process conditions that enable the suppressing of a contact between oxygen and exposed metal surfaces according to illustrative embodiments.

FIG. 2c schematically illustrates the semiconductor device 200 during a cleaning process 230, which, in one illustrative embodiment, may represent a wet chemical cleaning process, for instance, using the solution 221, which may have the significantly reduced oxygen contents due to the treatment 220. Moreover, the cleaning process 230 may be performed in an ambient 231 that is designed to suppress a contact of oxygen with the exposed barrier layer 213 and the cleaning solution 221, if a wet chemical cleaning process is considered. For instance, the process ambient 231 may be established within an appropriate process chamber by creating appropriate pressure conditions and establishing a substantially inert atmosphere, wherein a content of oxygen may be approximately 5 ppm and less. In the case of a wet chemical process, the ambient 231 may be provided by the cleaning solution 221, which may thus enclose the device 200, thereby establishing the ambient 231 with the reduced contents of oxygen since the solution 221 may be provided as an oxygen-depleted solution, as previously described. Additionally, a substantially oxygen-free gas atmosphere may be established, even if the device 200 may be substantially completely immersed in the corresponding cleaning solution 221. In some illustrative embodiments, suitable oxygen gettering substances or oxygen scavengers 232 may be introduced into the ambient 231, for instance, by incorporating the substances 232 into the solution 221 and/or by providing these materials during the cleaning process 230 and/or applying the substances 232 on the exposed surface of the barrier layer 213. For example, substances such as 3,4,5 hydro oxybenzoe acid, hydrazine, hydroxylamine and the like may be used for the materials 232 wherein, for instance, when provided in the solution 221, a concentration of approximately 0.5-1 vol % (volume percent) may be used. Thus, due to the presence of the oxygen gettering materials 232 in the ambient 231, a contact of free oxygen atoms or molecules with the exposed surface portions of the layer 213 may be significantly reduced. In still other illustrative embodiments, a reducing agent 233 may be applied during the process 231, for instance, by incorporating the substance 233 in the solution 221 or by otherwise applying the substance 233 during the cleaning process 230. For example, dimethylaminobenzoate (DMAB) may be used. Thus, by providing a combination of the reducing agent 233 and the oxygen gettering material 232, an enhanced combined effect may be obtained.

In still other illustrative embodiments, a surfactant 234 may also be supplied, wherein the type of corresponding surface reacting agent or surfactant 234, which may be advantageous in wetting the exposed surface 213, may be selected on the basis of the substances 232, 233 so as to estimate a corresponding effect of this combination in view of the creation of unwanted contaminants. An appropriate selection of the surface reactive component 234 may readily be determined on the basis of experiment so as to investigate the effect on the presence of oxygen, wherein the provision of the surfactant 234 may even enhance the overall efficiency of the ambient 231 or of a subsequent ambient for directly depositing a metal, as will be described with reference to FIG. 2d.

Figure 2D:
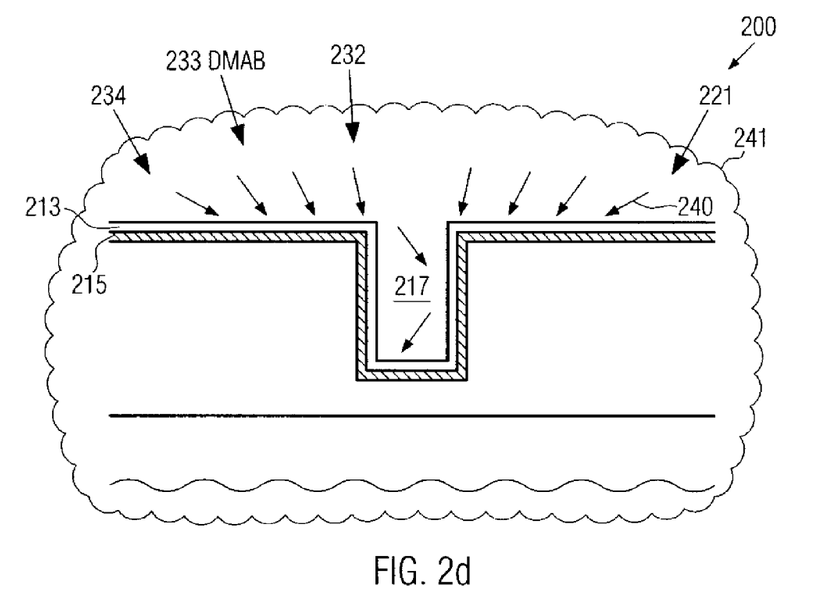

FIG. 2d schematically illustrates the semiconductor device 200 when exposed to an electrochemical deposition process 240, such as an electroless deposition process, in order to form an initial portion 215 of a metal to be filled into the opening 217. The initial portion 215 may also act as a seed layer for a subsequent fill step, which may be performed on the basis of different process parameters compared to the electrochemical deposition process 240. During the process 240, an appropriate electrolyte solution may be applied to the device 200 which may comprise, for the deposition of copper, EDTA, NAOH, HCHO, or any other well-established recipes, wherein, for instance, in one illustrative embodiment, an electrolyte solution as available from Semitool Inc. may be used. Furthermore, the deposition process 240 may be performed on the basis of a process ambient 241 which is also designed to suppress the presence of oxygen so as to reduce the probability of creating oxygen-based contaminants. For example, the ambient 241 may be established on the basis of a gaseous atmosphere including inert gases, such as nitrogen, argon and the like, wherein the contents of oxygen may be as low as approximately 5 ppm or less. In still other illustrative embodiments, the oxygen-suppressing ambient 241 may be established, in addition to an appropriate gas atmosphere, by supplying the oxygen gettering substances 232 and/or reducing agents 233, which may be accomplished by incorporating the substances 232 and/or 233 into the respective electrolyte solution of the deposition process 240. Furthermore, as previously explained, prior to beginning the actual deposition 240, a surfactant 234 may be applied, the effect of which, in combination with the substances 232 and 233, may be determined in advance so as to obtain a desired combined effect.

Figure 2E:
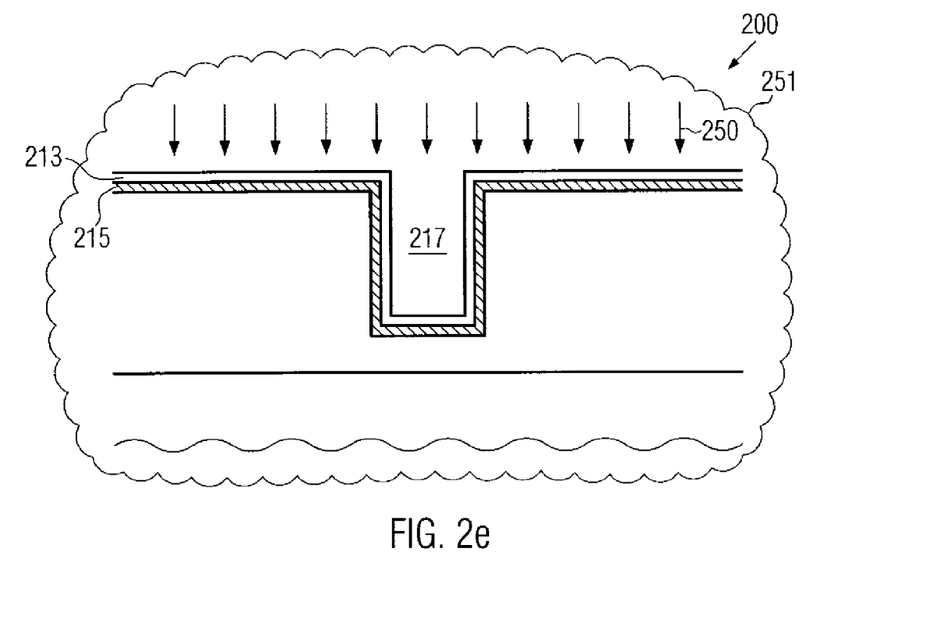

FIG. 2e schematically illustrates the semiconductor device 200 according to a further illustrative embodiment in which the device 200 is exposed to a cleaning process 250 after a specified thickness of the initial layer portion or seed layer 215 is achieved. For instance, after depositing approximately 10-80 nm on the basis of the deposition process 240, the surface of the layer 215 may be cleaned on the basis of appropriate substances, such as de-ionized water and the like, wherein the process 250 may also be performed on the basis of a process ambient 254 that is designed to suppress the presence of free or reactive oxygen, which may be accomplished by appropriately conditioning a respective cleaning substance, such as de-ionized water, by actively de-gassing the substance as is, for instance, also explained with reference to the solution 221. Moreover, an appropriate gas atmosphere may be established, for instance on the basis of any inert gas or gas mixture, wherein a content of oxygen may be maintained at approximately 5 ppm or less. With respect to the supply of any cleaning substances during the process 250, the same criteria apply as previously set forth when referring to the cleaning solution 221.

Figure 2F:
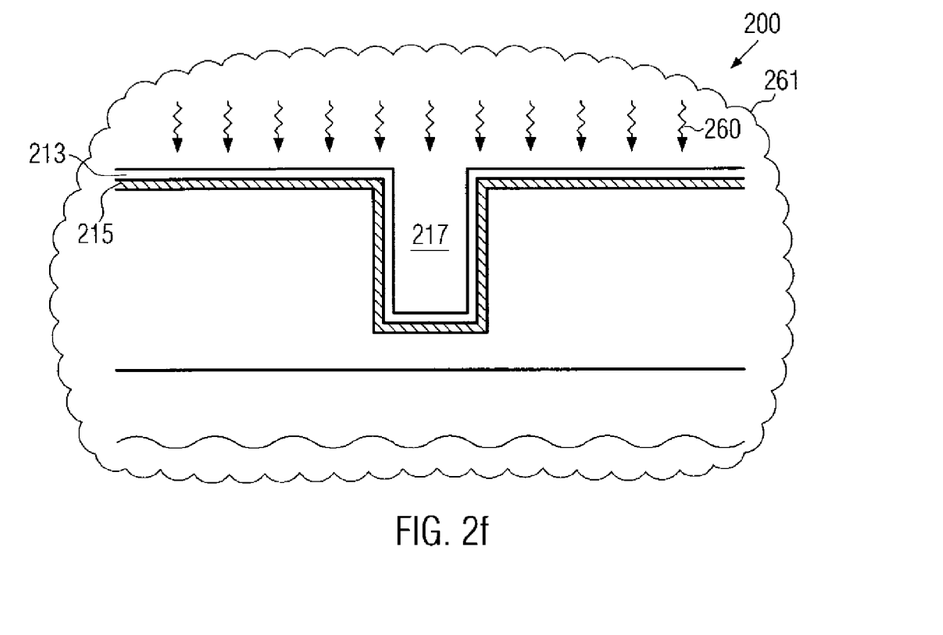

FIG. 2f schematically illustrates the device 200 according to a further illustrative embodiment in which a thermal treatment 260 may be performed in order to enhance the crystalline configuration of the portion or seed layer 215, wherein the thermal treatment 260 may also be performed in an appropriate process ambient 261 designed to suppress the presence of oxygen. Moreover, in one illustrative embodiment, the ambient 261 may be established on the basis of a reducing atmosphere which may include nitrogen, or in other cases a forming gas, i.e., a mixture of hydrogen and nitrogen. Consequently, even minute amounts of oxygen, which may react with the exposed surface of the layer 215 or which may diffuse through the interface 213, may be efficiently neutralized, thereby maintaining the actual reaction rate of free oxygen with exposed surfaces at a very low level that may not substantially deteriorate the characteristics of the final metal. The thermal treatment 260 may, for instance, be performed at temperatures of approximately 100-300° C. for a time period of several minutes to several hours.

Figure 2G:
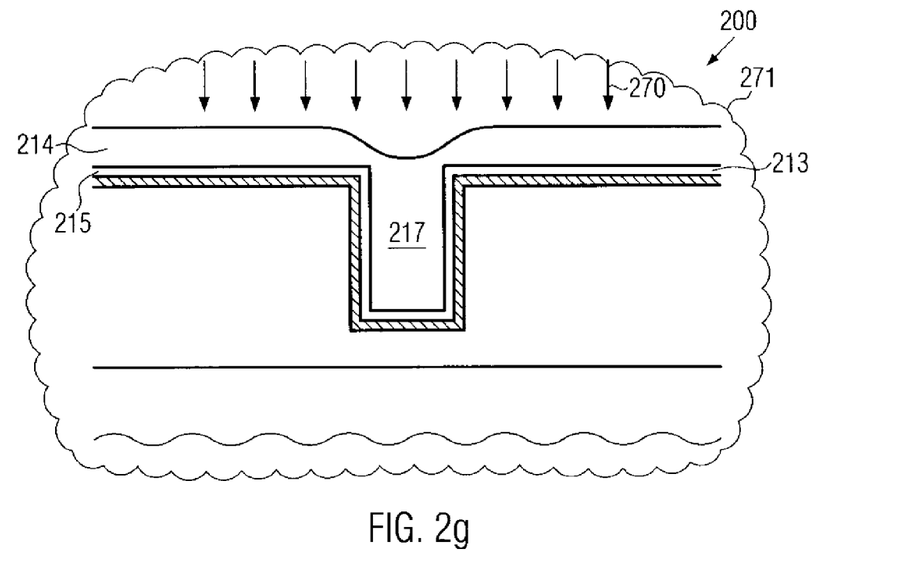

FIG. 2g schematically illustrates the semiconductor device 200 during a further electrochemical deposition process 270 for forming a metal layer 214 so as to completely fill the opening 217. The electrochemical deposition process 270 may represent an electroplating process or an electroless deposition process, or any combination thereof, wherein appropriate process parameters, such as the application of an appropriate pulse regime if an electroplating process is considered, a respective electrolyte solution, collimators for controlling the electrolyte flow and the like, are selected such that a desired bottom to top fill behavior is achieved. In some illustrative embodiments, the process 270 may be performed in a process ambient 271 designed to suppress the presence of free or reactive oxygen, for instance, by establishing a gas atmosphere on the basis of inert gases, such as nitrogen and the like, as previously discussed. Furthermore, additionally or alternatively, the oxygen-suppressing ambient 271 may be established by adding appropriate oxygen gettering materials, such as the substances 232, reducing agents 233 and the like, as is described with respect to the deposition process 240 and the electrolyte solution used.

After the deposition process 270, the further processing of the device 200 may be continued on the basis of well-established techniques, for instance, by removing any excess material of the layer 214, possibly in combination with a further thermal treatment and the like. Thereafter, any further metallization structures may be formed, wherein substantially the same process flow may be used, as described with reference to FIGS. 2a-2g.

Figure 3A:
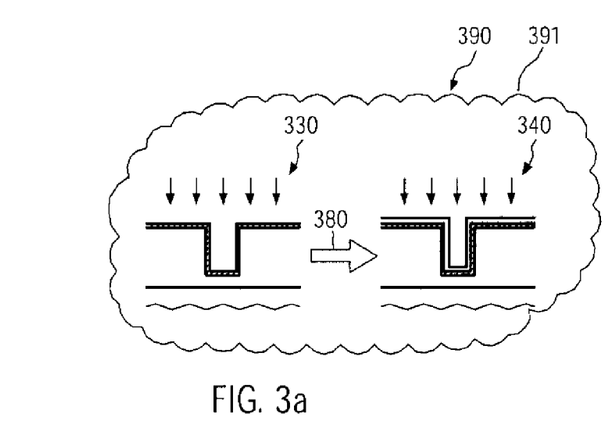
FIGS. 3a-3b schematically illustrate a process sequence that is performed on the basis of an oxygen-depleted process ambient, wherein the process sequence may also include transport activities according to still further illustrative embodiments.

FIG. 3a schematically illustrates a process sequence 390 for forming a metallization structure on the basis of a highly conductive metal, such as copper, silver, alloys thereof and the like, and a barrier material, wherein the highly conductive metal may be directly deposited on the barrier material by an electrochemical deposition process, as previously explained. For this purpose, the process sequence 390 may comprise a cleaning process 330 for cleaning an exposed surface of a barrier layer, such as the barrier layer 213 of the device 200, and a direct electrochemical deposition process 340 for forming an appropriate portion or seed layer, such as the seed layer 215, directly on the cleaned barrier layer. Furthermore, the process sequence 390 may comprise at least one substrate transport activity 380, which may include the transport of the respective substrate from a process chamber for the process 330 to a process chamber or reactor for the process 340. The process sequence 390 may be performed within an appropriate process ambient 391 that is designed as an oxygen-suppressing ambient, which may be understood as an ambient in which an exposed surface of a substrate to be stepped through the sequence 390 may be exposed to any fluids or gases or any other materials having a content of free oxygen that is approximately 5 ppm or less. For example, for the transport activity 380, respective load lock chambers and transport carriers may be provided, in which a gas atmosphere may be established so as to maintain a reduced oxygen content. In other cases, the transport activities 380 may be accomplished on the basis of tool-internal transport paths, which may interconnect respective process chambers without requiring loading and unloading of substrates into and from transport carriers.

Figure 3B:
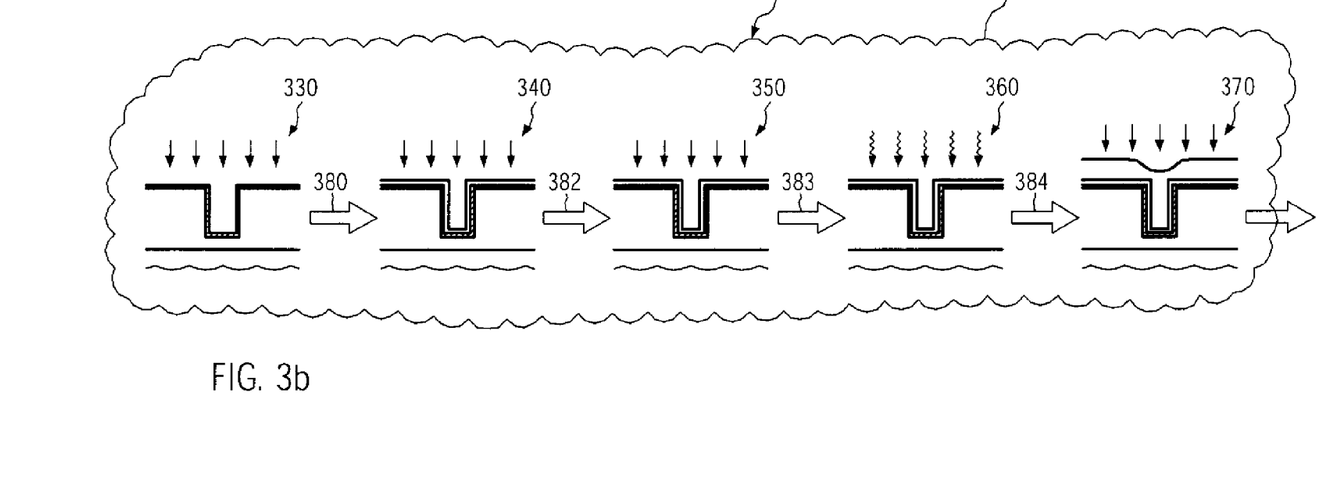

FIG. 3b schematically illustrates the process sequence 390 according to further illustrative embodiments in which the respective process ambient 391 may be established for a plurality of process steps in addition to the steps 330 and 340, for instance comprising steps 350, 360, 370 for cleaning a seed layer, thermally treating the seed layer and depositing the bulk metal, respectively, wherein respective transport activities 382, 383, 384 may be performed, depending on the configuration of the respective process tools. It should be appreciated that some of the transport activities 380, 382, 383, 384 may be obsolete, if subsequent process steps may be performed within the same process chamber. Thus, since the ambient 391 covers each of the process steps 330, 340, 350, 360, 370 and the respective transport activities 380, 382, 383, 384, the presence of oxygen at the interface between a barrier layer and a highly conductive metal may be maintained at a very low level, thereby providing enhanced characteristics of the finally obtained metal.

As a result, the present disclosure provides a concept for identifying the degradation of an interface between a barrier material and a metal directly deposited thereon by electrochemical deposition processes and for reducing the interface degradation. To this end, the presence of free or reactive oxygen during critical process steps is suppressed by establishing appropriate process conditions. For example, oxygen gettering substances, reducing agents and the like may be provided in wet chemical process steps in addition to a substantially inert gas atmosphere. On the other hand, any other processes may be performed in an inert or reducing gas ambient, thereby providing an appropriate performance of sophisticated metal structures with respect to electromigration and the mechanical and electrical behavior. Therefore, "direct on barrier" plating regimes according to the principles disclosed herein may be employed in volume production of sophisticated metallization structures while complying to the strict constraints with respect to reliability, while even enhancing throughput compared to sophisticated non-electrochemical seed layer deposition techniques.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
 forming a conductive barrier layer on a patterned layer of a semiconductor device;
 treating a wet chemical cleaning solution for cleaning said barrier layer so as to remove at least some of the oxygen dissolved in said wet chemical cleaning solution;
 cleaning said barrier layer by using said wet chemical cleaning solution in a cleaning ambient designed to suppress exposure of said wet chemical cleaning solution and said barrier layer to oxygen;
 incorporating an oxygen gettering material into said wet chemical cleaning solution at least when using said wet chemical cleaning solution for cleaning said barrier layer; and directly depositing a metal on said barrier layer by an electrochemical deposition process in a deposition ambient designed to suppress exposure to oxygen during said deposition process.

2. The method of claim 1, wherein treating said wet chemical cleaning solution comprises de gassing said wet chemical cleaning solution in the presence of an inert gas ambient.

3. The method of claim 1, wherein said wet chemical cleaning solution comprises hydrofluoric acid (HF).

4. The method of claim 1, wherein said oxygen gettering material comprises at least one of 3,4,5 hydroxybenzoe acid, hydrazine and hydroxylamine.

5. The method of claim 1, further comprising using a reducing agent in combination with said wet chemical cleaning solution at least when cleaning said barrier layer.

6. The method of claim 1, wherein directly depositing a metal on said barrier layer comprises forming a seed layer, and wherein said method further comprises cleaning said seed layer in a second cleaning ambient designed to suppress exposure of said seed layer to oxygen.

7. The method of claim 6, further comprising performing a thermal treatment after cleaning said seed layer, wherein said thermal treatment is performed in an ambient so as to suppress exposure of said seed layer to oxygen.

8. The method of claim 7, further comprising establishing a reducing atmosphere in said ambient.

9. The method of claim 8, wherein said reducing atmosphere comprises at least one of hydrogen and a mixture of hydrogen and nitrogen.

10. The method of claim 6, further comprising performing an electrochemical fill deposition process on the basis of said seed layer, said electrochemical fill deposition process designed to fill openings in said patterned layer.

11. The method of claim 1, further comprising establishing a transport ambient designed to suppress exposure to oxygen when transporting said semiconductor device prior to and during directly depositing said metal on said barrier layer.

12. The method of claim 1, further comprising providing a chemical agent in an electrolyte solution of said electrochemical deposition process, said chemical agent suppressing oxidation of said barrier layer.

13. The method of claim 1, wherein said barrier layer comprises tantalum.

14. The method of claim 1, wherein said metal comprises copper.

15. A method, comprising:
forming a barrier layer on a surface portion of an opening formed in a dielectric layer of a semiconductor device; and
performing a process sequence for directly depositing a metal on said barrier layer using an electrochemical deposition process in a process ambient designed to suppress contact of said barrier layer with oxygen during said process sequence, wherein said process sequence comprises cleaning said barrier layer by a wet chemical process using an oxygen gettering material.

16. The method of claim 15, wherein said process sequence comprises treating said barrier layer with a surfactant for wetting a surface of said barrier layer prior to forming a metal on said surface.

17. The method of claim 15, wherein said process sequence comprises forming a seed layer by a first electrochemical deposition step and filling said opening on the basis of said seed layer by a second electrochemical deposition step, said first and second steps being based on different process parameters.

18. The method of claim 17, wherein said process sequence further comprises cleaning said seed layer.

19. The method of claim 18, wherein said process sequence further comprises performing a thermal treatment of said seed layer.

20. A method for directly depositing a metal on a barrier layer by an electrochemical deposition process, the method comprising:
providing a substrate comprising a patterned layer having formed thereon said barrier layer;
establishing a process ambient for suppressing a reaction of said barrier layer with oxygen;
cleaning said barrier layer in said process ambient; and
depositing at least a portion of said metal on said barrier layer in said process ambient wherein establishing said process ambient comprises using an oxygen gettering material during cleaning said barrier layer and depositing said portion.

21. The method of claim 20, wherein said barrier layer is cleaned by using a wet chemical treatment on the basis of diluted hydrofluoric acid.

22. The method of claim 20, further comprising performing a substrate transport activity in said process ambient between cleaning the barrier layer and depositing said portion.

* * * * *